(12) United States Patent
Sun

(10) Patent No.: US 9,818,557 B2
(45) Date of Patent: Nov. 14, 2017

(54) KEY STRUCTURE

(71) Applicant: Jen-Wen Sun, New Taipei (TW)

(72) Inventor: Jen-Wen Sun, New Taipei (TW)

( * ) Notice: Subject to any disclaimer, the term of this patent is extended or adjusted under 35 U.S.C. 154(b) by 193 days.

(21) Appl. No.: 14/590,005

(22) Filed: Jan. 6, 2015

(65) Prior Publication Data

US 2015/0213974 A1  Jul. 30, 2015

(30) Foreign Application Priority Data

Jan. 28, 2014  (TW) .............................. 103201825 U

(51) Int. Cl.
| | | |
|---|---|---|
| *H03K 17/975* | (2006.01) | |
| *H01H 13/14* | (2006.01) | |
| *H03K 17/98* | (2006.01) | |
| *G06F 3/023* | (2006.01) | |
| *G06F 3/039* | (2013.01) | |
| *H01H 13/02* | (2006.01) | |
| *H01H 13/10* | (2006.01) | |

(52) U.S. Cl.
CPC ........... *H01H 13/14* (2013.01); *G06F 3/0238* (2013.01); *G06F 3/039* (2013.01); *H01H 13/023* (2013.01); *H01H 13/10* (2013.01); *H03K 17/98* (2013.01); *H01H 2219/012* (2013.01); *H01H 2219/016* (2013.01); *H01H 2221/044* (2013.01); *H01H 2221/07* (2013.01)

(58) Field of Classification Search
CPC .. H03K 17/98; H03K 17/9618; H03K 17/992; H03K 17/9622; G06F 3/0412; G06F 3/0489
USPC .................. 200/314, 600; 345/173, 172, 170
See application file for complete search history.

(56) References Cited

U.S. PATENT DOCUMENTS

| | | | | |
|---|---|---|---|---|
| 6,326,569 B1* | 12/2001 | Ardrey | .................... | G09F 13/04 200/314 |
| 7,005,596 B2* | 2/2006 | Maeda | ................. | H01H 25/041 200/314 |
| 8,735,755 B2* | 5/2014 | Peterson | .............. | H03K 17/962 200/600 |
| 8,859,923 B2* | 10/2014 | Obata | ..................... | G06F 3/044 362/612 |
| 8,896,540 B2* | 11/2014 | Wakasa | ................... | G06F 3/018 345/170 |

(Continued)

FOREIGN PATENT DOCUMENTS

EP         231007 A2 *  1/1987  ........... H01H 13/702

*Primary Examiner* — Felix O Figueroa
(74) *Attorney, Agent, or Firm* — Leong C. Lei

(57) ABSTRACT

A key structure includes, from top to bottom in sequence: at least one key main body, made of light transmissible material; a key frame, adapted to mount the key main body; an elastic supporting portion, allowing the key main bodies to move back and forth vertically; at least one bump, formed on one side of the elastic supporting portion; a detection module, sensing the action of the key main body and allowing the bump to be in touch therewith selectively; and a display screen, configured on one side of the detection module. A user can see the bottom display screen through the key main body directly, and the elastic supporting portion drives the bumps to move downward to touch the detection module after the user presses the key main body down. Whereby, the applicable range of the present invention is increased by changing the contents of the display screen.

4 Claims, 8 Drawing Sheets

(56) References Cited

U.S. PATENT DOCUMENTS 8,917,242 B2 * 12/2014 Yang .................. G06F 3/04886
                                                                        345/168

\* cited by examiner

KEY STRUCTURE

TECHNICAL FIELD OF THE INVENTION

The present invention relates to a key structure, and more particularly to a key structure, which is simple in structure and easy in manufacturing, test, image or animation displayed thereon being able to be changed arbitrarily.

DESCRIPTION OF THE PRIOR ART

General keys are of one-to-one function, namely, what is shown on a key means what kind of function it will be present after the key is pressed; all kinds of computer keyboards, television remote controllers, communication facilities and the like are so acted. In addition, even if keys are known as multi-functional ones, they are only increased with a press and hold function or set up with different actions according to the number of pressing times thereof such that they, strictly speaking, still ones with a one-to-one function.

To allow a keyboard to have a illumination feature, a backlight module or light source module is configured below the keyboard comparing to traditional keyboards, and the surface housing thereof is designed to be transparent or pervious, allowing the light emitted from a light source on the bottom of the keyboard can penetrate the surface to achieve the illumination effect of the keyboard.

Although such kinds of transparent or translucent keys are allowed to display an illumination effect, the contact points on the keyboard are almost arranged straight below the keys, causing light spreading performance to be rather bad. Otherwise, the housing and light source module are connected together directly, and elastic elements used as contact points are arranged below. Thus, although the light spreading can be performed completely, a bad key contact or light source damage is always caused due to the insufficient supporting force below the light source module.

SUMMARY OF THE INVENTION

The main object of the present is to provide a key structure, allowing images displayed on a bottom display screen to respond directly to top transparent key main bodies via completely hollow structures, maintaining the stability of the key main bodies through a key frame and elastic supporting portion, and transmitting the actions of the key main bodies to a detection module through bumps, thereby achieving the effect of having a simple, durable key structure and a display screen.

To achieve the object mentioned above, the present invention proposes a key structure, including: at least one transparent key main body; a key frame, adapted to mount the key main body; an elastic supporting portion, allowing the key main bodies to move back and forth vertically and configured on the side edges of one face of the key main body; at least one bump, formed on one side of the elastic supporting portion away from the key main body; a detection module, adapted to sense the action of the key main body and configured on one side of the bump away from the elastic supporting portion; and a display screen, configured on one side of the detection module away from the bump and an image displayed thereon being able to be viewed from the key main body. A user can see the bottom display screen through the key main body, and the elastic supporting portion drives the bumps to move downward to touch the detection module after the user presses the key main body down. Furthermore, the command action displayed on the display screen is executed by pressing the key main body, and the elastic supporting portion springs back to drive the bumps to separate from the detection module after the press action is done. At this point, the user waits for a further press command.

From the descriptions mentioned above, it is clear that the present invention can solve the problems of monotonous functions without change, incomplete light presence and insufficient durability caused from conventional keys, and achieve practical progress of the above-memtioned advantages.

DETAILED DESCRIPTION OF THE PREFERRED EMBODIMENTS

Figure 1:
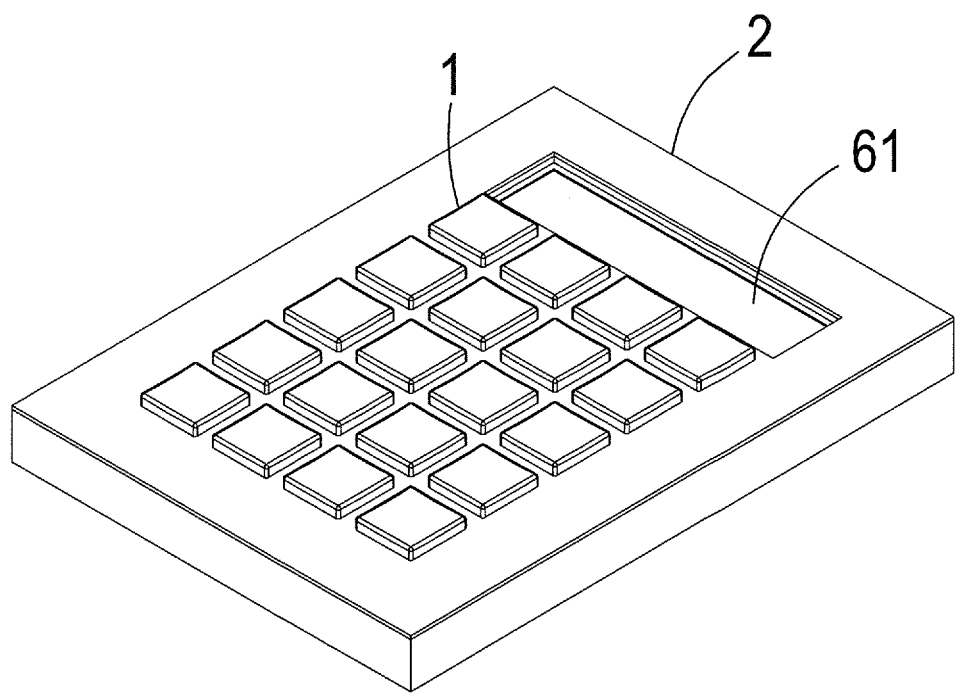
FIG. 1 is a three-dimensional view of a preferred embodiment of a key structure according to the present invention.
Figure 2:
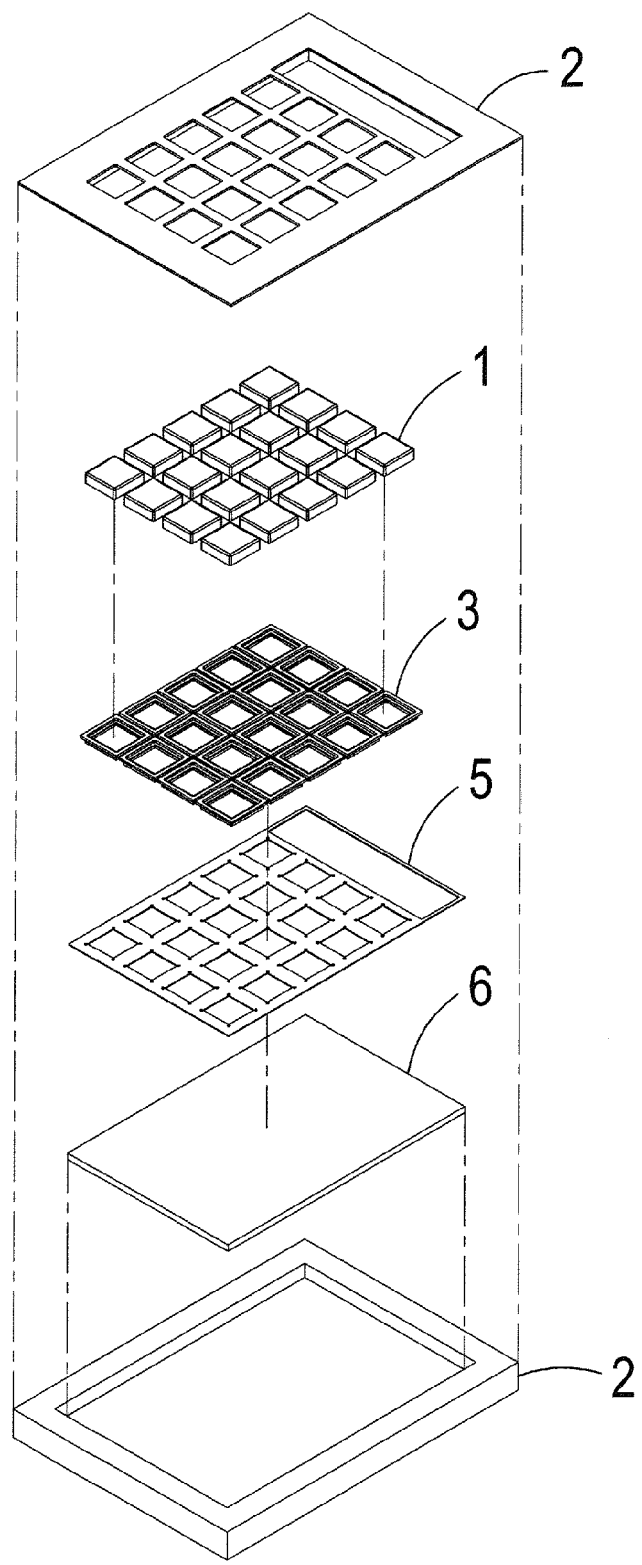
FIG. 2 is an exploded view of the embodiment of a key structure according to the present invention.
Figure 2A:
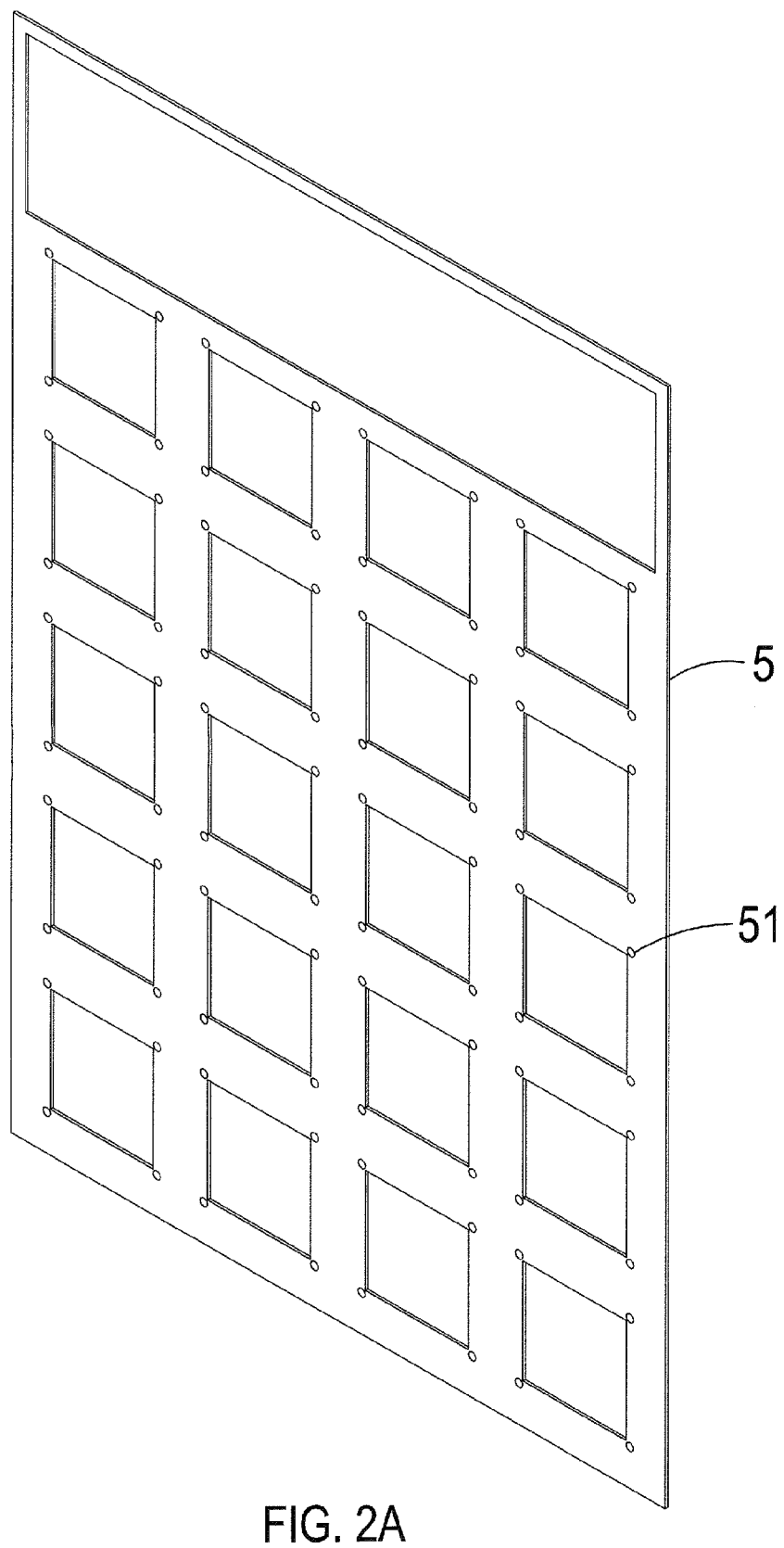
FIG. 2A is an enlarged perspective view of a detection module shown in FIG. 2.
Figure 3:
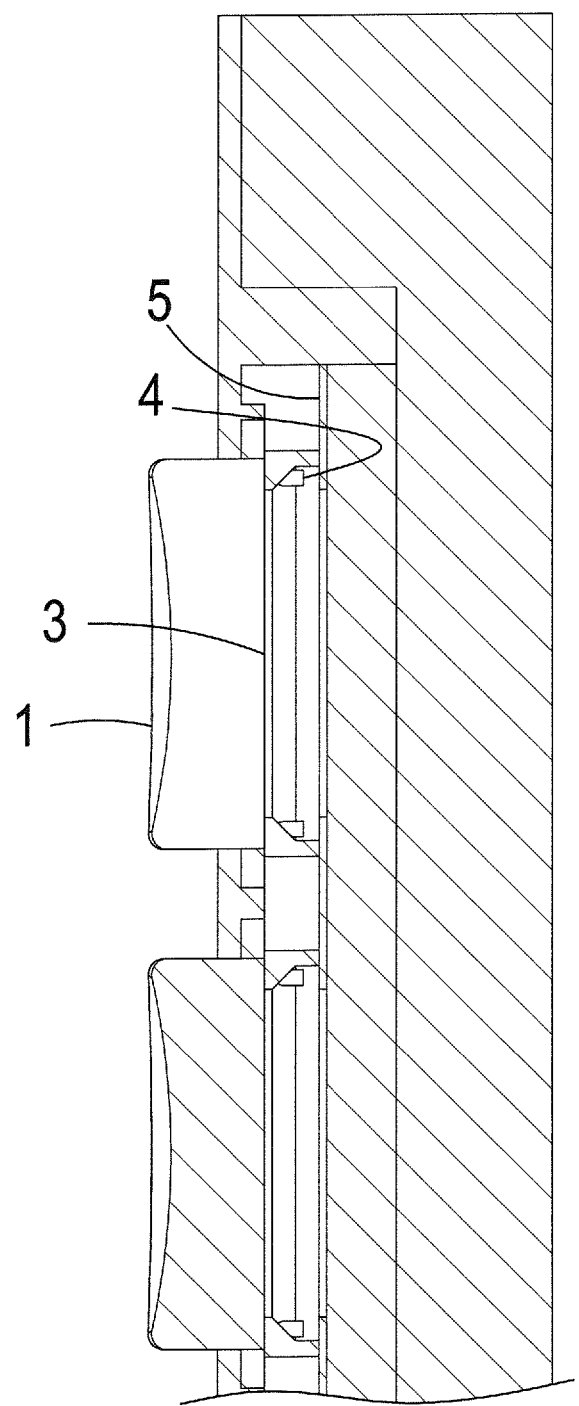
FIG. 3 is a cross-sectional view of the embodiment of a key structure according to the present invention.
Figure 4:
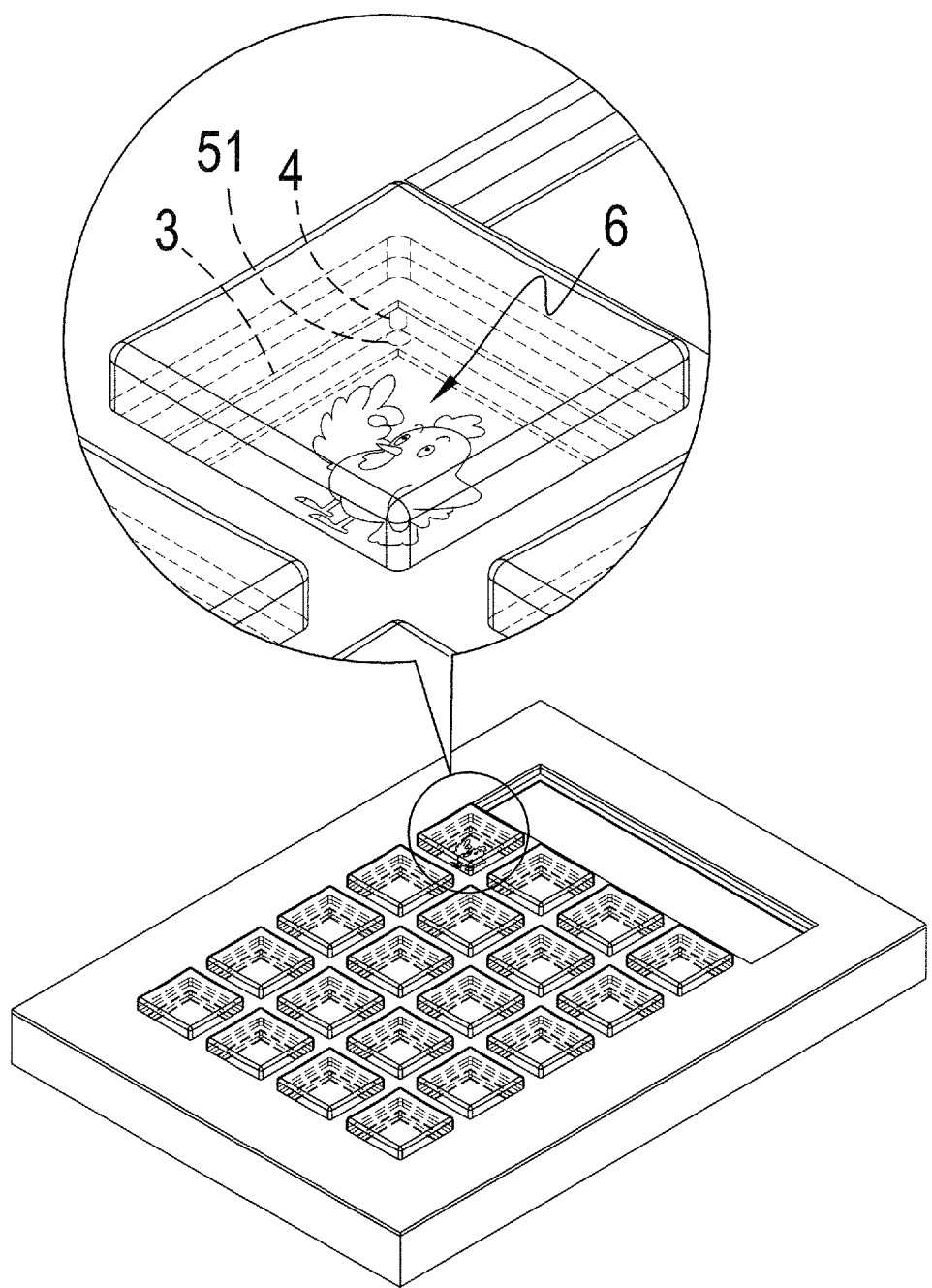
FIG. 4 is a perspective view of the embodiment of a key structure according to the present invention, where an image displayed on a display screen can be seen.

Referring to FIGS. 1, 2, 2A and 3, which respectively are a three-dimensional view, exploded view, partly enlarged view and cross-sectional view of a preferred embodiment of a key structure according to the present invention, it is clear from the figures that the key structure of the present invention includes:

at least one key main body 1, made of a light transmissible material;

a key frame 2, adapted to mount the key main body 1;

an elastic supporting portion 3, configured on the side edges of one face of said key main body 1 and allowing the key main body 1 to be moved back and forth vertically;

at least one bump 4, formed on one side of the elastic supporting portion 3 away from the key main body 1;

a detection module 5, adapted to sense the action of the key main body 1, configured on one side of the bump 4 away from the elastic supporting portion 3 and allowing the bump 4 to be in touch therewith, a plurality of receiving ends 51 corresponding to the bumps 4 being formed on the detection module 5; and a display screen 6, configured on one side of the detection module away from the bump 4, images displayed thereon being capable of being viewed from the key main body 1, the display screen 6 further including a message displaying portion 61.

Referring to FIGS. 1 to 6, which respectively are a three-dimensional view, exploded view, partly enlarged view, cross-sectional view, perspective view, schematic view upon impletementation and schematic view upon implementation, it is clear from the figures that a user may see the bottom display screen 6 directly through the pervious-to-light key main body 1 by assembling the above components together, and the visible range of the display screen 6 can be remained because each element between the key main body 1 and display screen 6 is designed hollow, not influencing the complete appearance display of the image. Moreover, the display screen 6 is configured at the bottom such that the screen is not caused to be damaged due to prolonged use or instable supporting element.

Figure 5:
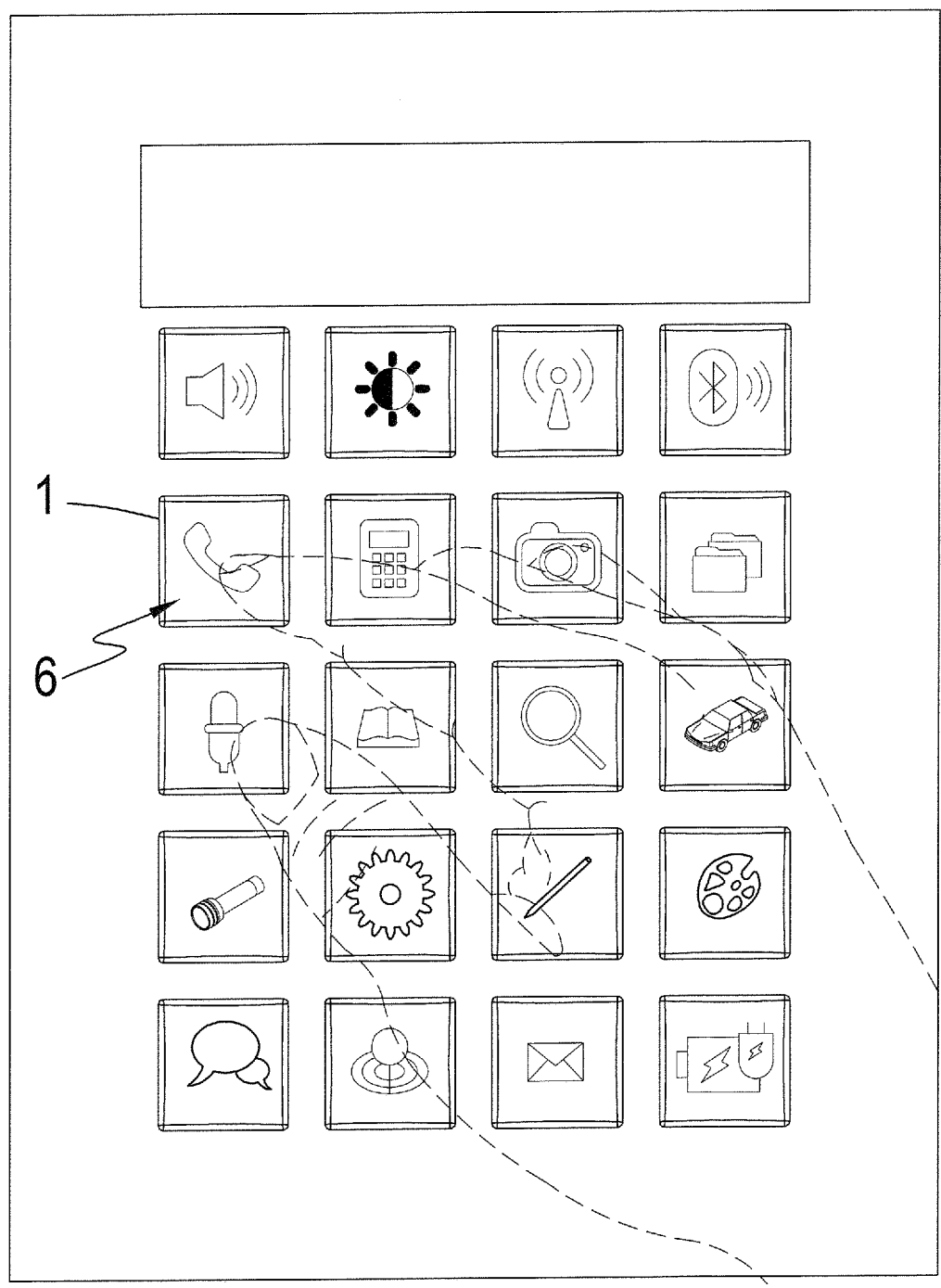
FIG. 5 is a schematic view of the embodiment of a key structure according to the present invention upon implementation.
Figure 6:
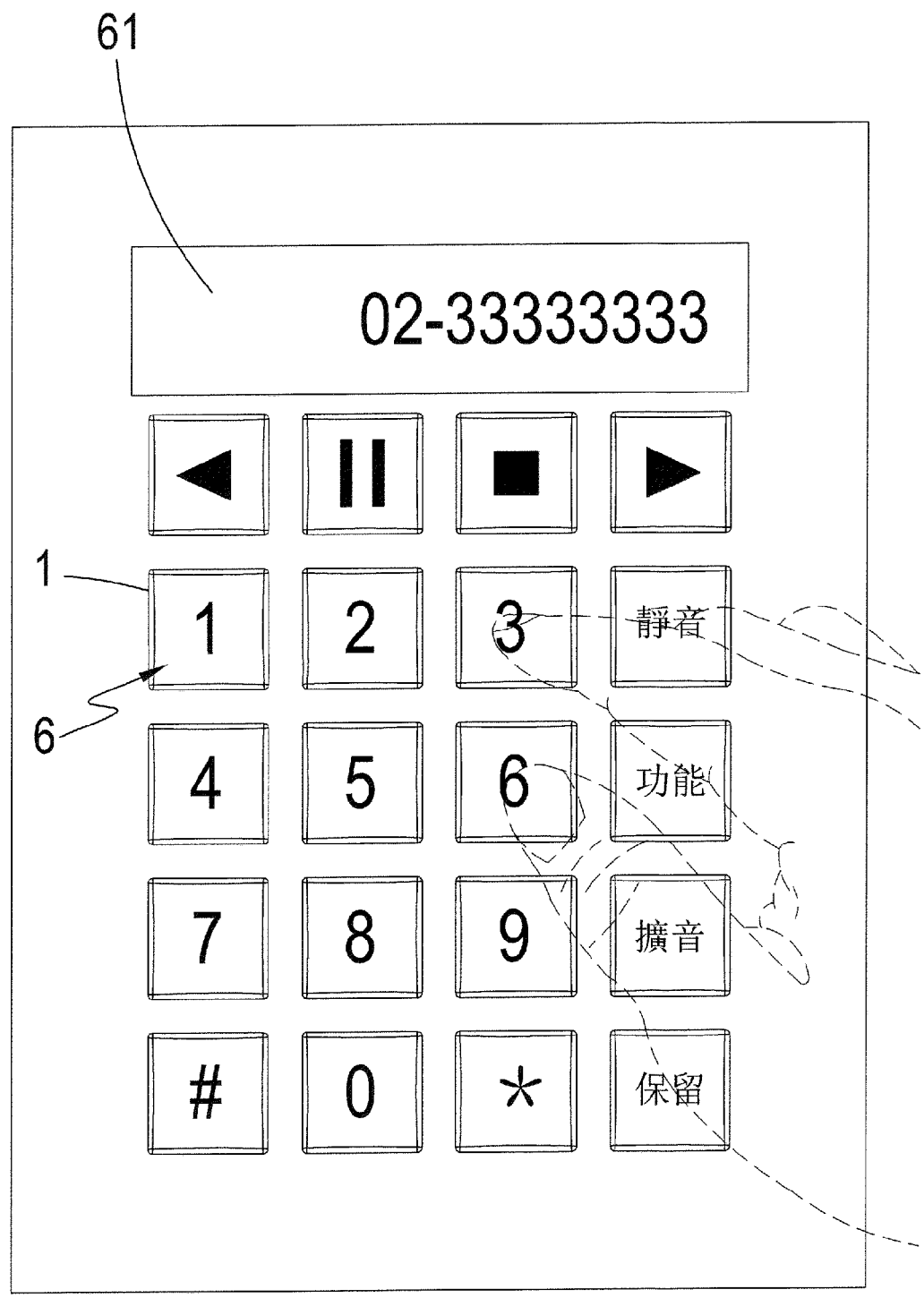
FIG. 6 is another schematic view of the embodiment of a key structure according to the present invention upon implementation.

Therefore, the downwardly pressing action of the key main body 1 is allowed not to be shifted too much due to the position limiting feature of the key frame 2 when a user presses down the key main body 1 even if on purpose, because the elastic supporting portion 3 configured below the key main body 1 surrounds the side edges of the key main body 1 and the bumps 4 are configured on the four corners of the key main body 1, only exerted with pressure, any bump 4 can then touch the receiving end 51 of the detection module 5, and the action represented by the text, image or animation can be responded to the display screen 6 and further displayed on the message displaying portion 61. Furthermore, the elastic supporting portion 3 recovers elastically immediately after the press operation is done, allowing the bumps 4 to be separated from the detection module 5, and the display of text, image or animation to be changed selectively according to the initial setting of the display screen 6. For example, the display screen 6 changes the display to other numeral or image correspondingly to each key main body 1 as FIG. 6 shows after the key main body 1 displayed as a telephone image is pressed down as FIG. 5 shows. Whereby, the original features of the key are raised to a higher level; the key is not only a single-function key any more. Furthermore, the bottom display screen 6 is further protected because all components are accommodated within the key frame 2, allowing the applicability of the present invention to be improved drastically to have more usability.

Figure 7:
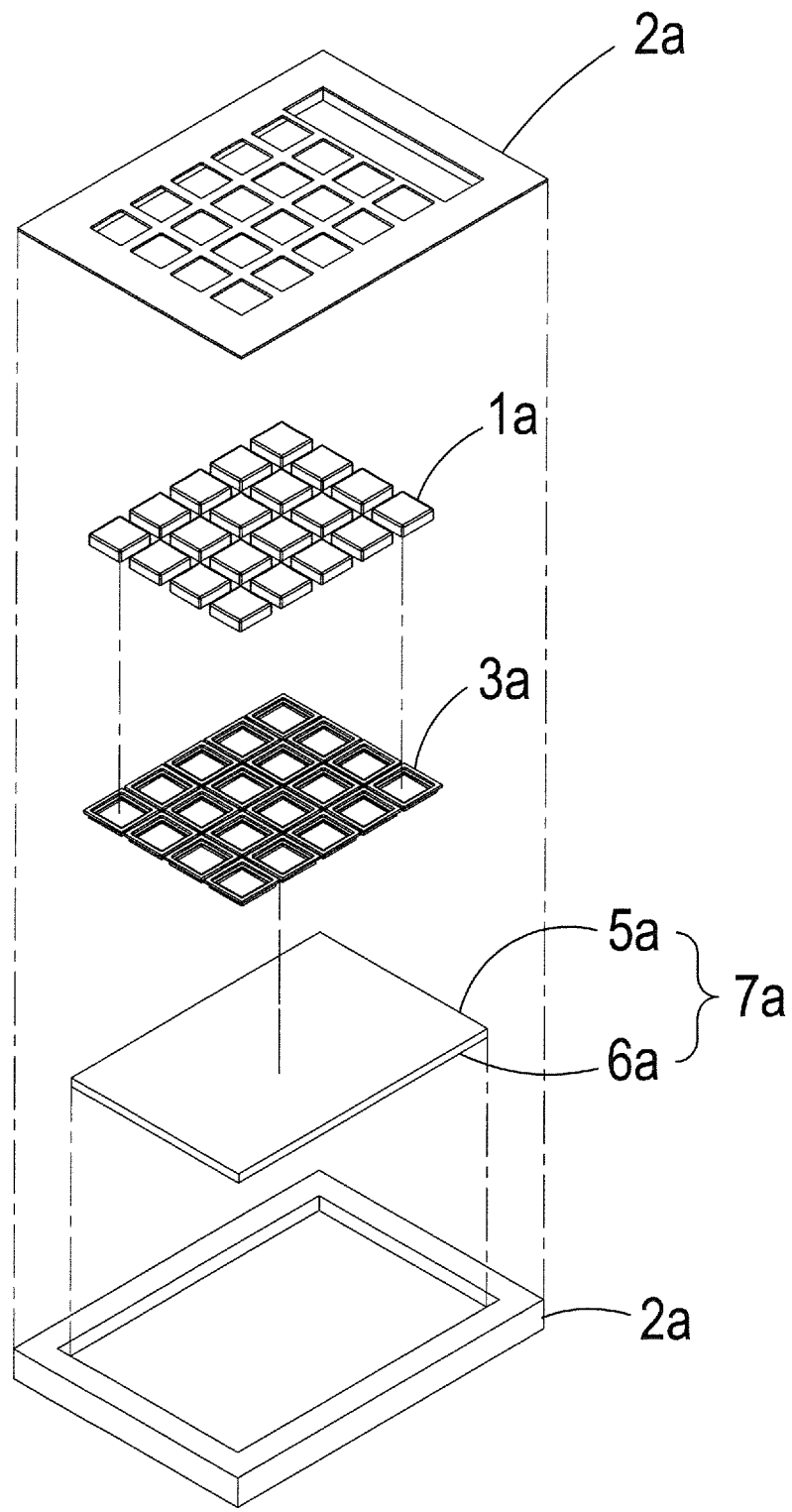
FIG. 7 is an exploded view of another preferred embodiment of a key structure according to the present invention.

In addition, referring to FIG. 7, which is an exploded view of another preferred embodiment of a key structure according to the present invention, it is clear from the figure that in response to the use penetration of touch panels, the two layers of detection module 5a and display screen 6a of the original structure mentioned above are replaced with a touch panel 7a, a soft material is chosen for an elastic supporting portion 3a, the features of an original key main body 1a and key frame 2a are operated into coordination therewith, and all the effects of the present invention can similarly be achieved without causing damage to the touch panel 7a.

Conclusively, the present invention has the following advantages comparing with the conventional arts:

1. text, image or animation displayed on the key can be changed arbitrarily;

2. the display of an image will not be interfered by any structure, being capable of being present completely;

3. the display screen 6 being positioned at the bottom can reduce the damage to the display screen 6 caused from improper use;

4. the simple structure composition can decrease production cost; and 5. the applicability range of the key is broader because the display screen 6 enhances use durability.

I claim:

1. A key structure, comprising:
   at least one key main body, made of light transmissible material;
   a key frame, adapted to mount said key main body;
   an elastic supporting portion, configured on side edges of one face of said key main body, and allowing said main body to move back and forth vertically;
   at least one bump, formed on one side of said elastic supporting portion away from said key main body;
   a detection module, adapted to sense an action of said key main body, configured on one side of said bump away from said elastic supporting portion and allowing said bump to be in touch therewith selectively; and
   a display screen, configured on one side of said detection module away from said bump, images displayed thereon being able to be observed from said key main body;
   wherein the elastic supporting portion supports said key main body positioned thereon and is configured to surround the side edges of said key main body; and
   wherein the display screen is configured on the one side of said detection module that is away from said bump and is located under said detection module, the display screen comprising a first portion that corresponds to and is located under said key main body for displaying a first image that is observable through said key main body and a second portion that is different from and distant from the first portion, the second portion being set at a location that is outside an area covered by said key main body to provide a message displaying portion that allows for direct observation.

2. The key structure according to claim 1, wherein said detection module is in electric connection with said display screen to constitute a touch panel.

3. The key structure according to claim 1, wherein a specification of said display screen is one chosen from a group constituted by TFT, LCD, OLED and dot matrix LED module.

4. The key structure according to claim 1, wherein a plurality of receiving ends corresponding to said bumps are formed on said detection module.

* * * * *